United States Patent [19]

Whitwell et al.

[11] Patent Number: 5,087,609
[45] Date of Patent: Feb. 11, 1992

[54] FORMATION OF HIGH TEMPERATURE SUPERCONDUCTOR THIN FILMS BY SOL-GEL TECHNIQUES

[75] Inventors: George E. Whitwell, Campbell Hall; Meiylin F. Antezzo, Carmel, both of N.Y.

[73] Assignee: Akzo NV, Arnhem, Netherlands

[21] Appl. No.: 586,656

[22] Filed: Sep. 24, 1990

[51] Int. Cl.$^5$ .......................... B05D 5/12; B05D 3/02
[52] U.S. Cl. ........................ 505/1; 505/735; 505/734; 505/742; 427/62; 427/226; 427/126.3
[58] Field of Search ................ 505/1, 734, 735, 742; 427/62, 63, 226, 126.3; 106/287.18, 287.23

[56] References Cited

U.S. PATENT DOCUMENTS

| | | | |
|---|---|---|---|
| 4,920,093 | 4/1990 | Nonaka et al. | 505/1 |
| 4,943,558 | 7/1990 | Soltis et al. | 505/1 |

FOREIGN PATENT DOCUMENTS

| | | |
|---|---|---|
| 0280292A2 | 8/1988 | European Pat. Off. |
| 0300561A2 | 1/1989 | European Pat. Off. |
| 62-240691 | 10/1987 | Japan. |
| 2-6334 | 1/1990 | Japan. |

OTHER PUBLICATIONS

Moore et al., "Sol-gel processing of $Y_1Ba_2Cu_3O_{7-x}$ using alkoxide precursors, two systems yielding high degrees of thin film orientation and crystal growth", Materials letters, vol. 7, No. 12, Mar. 1989, pp. 415–424.

*Primary Examiner*—Shrive Beck
*Assistant Examiner*—Roy V. King
*Attorney, Agent, or Firm*—Richard P. Fennelly; Louis A. Morris

[57] ABSTRACT

A process for forming an alkoxide-derived yttrium-barium-copper oxide high temperature superconductor thin film by sol-gel processing is disclosed. It comprises first forming a thin film comprising solubilized yttrium and barium alkoxides and copper aminoalkoxide, under an inert gas atmosphere, on a non-reactive substrate, the amount of copper amino alkoxide being in excess of the stoichiometric amount to compensate for losses due to volatility of the copper amino alkoxide. The coating composition is then heated first in a moisture laden inert gas atmosphere, to hydrolyze the alkoxides, to temperatures in excess of the formation temperature of the superconductor. It is thereafter calcined in an oxygen atmosphere at higher temperatures to form the high temperature superconductor thin film.

6 Claims, No Drawings

FORMATION OF HIGH TEMPERATURE SUPERCONDUCTOR THIN FILMS BY SOL-GEL TECHNIQUES

BACKGROUND OF THE INVENTION

In commonly owned co-pending U.S. Ser. No. 270,551, filed Nov. 14, 1988, now abandoned, it is proposed to use an alkoxyalkanol solvent to improve the spin coating of metal alkoxide precursors in the fabrication of metal oxide films on a desired substrate. The instant invention is an improvement of using such a technique in the manufacture of high temperature superconductor (HTSC) films;

Various disclosures exist in the scientific literature which are germane to the field of the instant endeavor:

1 G. Moore et al. in Materials Letter, Vol. 7, No. 12, March, 1989, pp. 415–424, discuss the sol-gel technique as it pertains to HTSC films. It discloses the use of yttrium and barium metals dissolved in methoxyethanol and a copper(II) ethoxide compound as the copper source. The heat treatment involves heat treatment in oxygen followed by a longer annealing heat treatment in oxygen as well. Excess barium was volatilized during the heat treatments enabling formation of the desired 1-2-3 phase for the HTSC.

2. European Patent Publication No. 280,292 relates to HTSC manufacture using alkoxides of yttrium and barium with a carboxylate of copper. This patent publication discloses the use of diethylene glycol monomethyl-ether as a solvent in certain of its embodiments. Firing in the atmosphere at elevated temperatures is disclosed.

3. European Patent Publication No. 300,561 also discusses the use of the sol-gel process to form HTSC films using a butanol solvent with yttrium and barium alkoxide and copper cyclohexanebutyrate precursors. Air firing in the temperature range of 175° C. to 900° C. forms an additional important aspect of the process shown in that patent.

4. U.S. Pat. No. 4,943,558 discusses forming HTSC films using a pre-oxygen nitrogen anneal for the HTS films formed on a silicon or silicon dioxide substrate. The annealing does not utilize a water saturated atmosphere in either the nitrogen annealing step or in the later oxygen annealing procedure.

SUMMARY OF THE INVENTION

The present invention relates to a process for forming an alkoxide-derived yttrium-barium-copper oxide high temperature superconductor thin film by forming a liquid thin film coating comprising solubilized yttrium, barium and copper alkoxides, under an inert gas atmosphere, on a non-reactive substrate, the amount of copper alkoxide being in excess of the stoichiometric amount to compensate for losses due to volatility of the copper alkoxide, by next heating the thus produced thin film liquid coating containing the aforementioned yttrium, barium, and copper precursors in a moisture laden inert gas atmosphere, to hydrolyze the alkoxides, to temperatures in excess of the formation temperature of the desired yttrium-barium-copper oxide superconductor, and thereafter calcining the film in an oxygen atmosphere at elevated temperature to form the high temperature superconductor thin film.

DESCRIPTION OF THE INVENTION

The chemical precursors for forming the HTSC films of this invention comprise yttrium and barium alkoxides, e.g., those containing alkoxyalkanol ligands such as yttrium methoxypropoxide and barium methoxypropoxide, and organic solvent soluble copper aminoalkoxides of the type described in co-pending U.S. Ser. No. 270,570, filed Nov. 14, 1988, which is also incorporated herein by reference. Since it has been unexpectedly found that the copper aminoalkoxide reagent has a higher volatility than the yttrium or barium precursors used, the amount of copper reagent that is to be used is increased over the amount that would normally be used on a straight stoichiometric basis to compensate for volatility losses. The amount of copper aminoethoxide that will be used will preferably be in the range of about 110% to about 150%, by weight, of the normal stoichiometric amount.

The application of the coating composition to the selected non-reactive substrate, e.g., zirconium oxide or magnesium oxide, takes place under an inert gas atmosphere in accordance with another novel aspect of the invention in order to prevent the formation of barium carbonate. Nitrogen gas is one selected inert atmosphere which can be used.

The third novel aspect of the invention involves the initial thermal processing of the coated substrate in a moisture laden inert atmosphere(e.g., nitrogen) in order to achieve hydrolysis of the alkoxide precursors described above without the formation of barium carbonate. This initial thermal processing takes place, for example, at temperatures of from about ambient to about 750° C., typically a temperature of about 250° C.

Once the above temperature has been reached, further thermal processing or calcining at higher temperatures (e.g., up to about 850° C.) takes place in the presence of oxygen to convert the coating into the desired HTSC thin film.

The present invention is further illustrated by the Examples which follow.

EXAMPLES

In the following Examples "OPrOMe" stands for 1-methoxy-2-propoxide, "OEtAm" stands for 2-amino-1-ethoxide, and "HOPrOMe" represents 1-methoxy-2-propanol.

COMPARATIVE EXAMPLE 1

An metal alkoxide solution for spinning films was prepared in a septum sealed bottle under $N_2$ and contained $Y(OPrOMe)_3$ (0.325 mmoles), $Ba(OPrOMe)_2$ (0.665 mmoles) and $Cu(OEtAm)_2$ (0.990 mmoles) in HOPrOMe (5 mls). Films spun on silicon wafers and cured at temperatures above 750° C. were not superconducting at 77° K. ESCA and XRD analysis of the film did not reveal the presence of the desired $YBa_2Cu_3O_{7-x}$ phase.

EXAMPLE 2

A solution was prepared in the fashion of Example 1, but with an Y:Ba:Cu ratio for the same precursors of 1.0:1.67:4.12. Films were spun from this solution on a $ZrO_2$ wafer in an $N_2$ filled glove box. The wafer was transferred to a tube furnace without exposure to ambient $CO_2$ and cured with a thermal and atmospheric profile of:

| 25–250° C. | 1 hr | $N_2/H_2O$ |
| 250 | 1 hr | " |
| 250–750 | 2 hr | " |

| | | |
|---|---|---|
| 750-825 | 30 min | $O_2$ |
| 850 | 10 min | " |
| 825-600 | 1 hr | " |
| 600-25 | 6 hr | " |

The film resistance vs. temperature was measured and dropped sharply to 0 ohms at 55° D. with an onset of 88° K. The phase $YBa_2Cu_3O_{7-x}$ was observed by ESCA and XRD, $BaCO_3$ was not.

COMPARATIVE EXAMPLE 3

A solution was prepared and used to spin films in the manner of Example 2, except that all spinning procedures were conducted in air and the firing procedures were done in dry oxygen. Some $Ba_2Cu_3O_{7-x}$ was observed by ESCA and XRD, as was $BaCO_3$. The films did not display superconducting behavior down to 12° K.

EXAMPLE 4

Variations in Y:Ba:Cu film stoichiometry are related to the firing profile in this series of preparations. These multi-layered films were cured between depositions in an Intex infra-red belt furnace. The solutions were prepared in MeOPrOH.

| | | | |
|---|---|---|---|
| Yttrium methoxy-propoxide | | 0.150 mmoles | |
| Barium methoxy-propoxide | | 0.275 mmoles | |
| Copper 2-amino-1-ethoxide | | 0.475 mmoles | |
| Inter-film cure step: | | | |
| Slow Intex | 2 in/min | 300° C. max | 20 min |
| Fast Intex | 10 in/min | 275° C. max | 8 min |

Final firing properties:

| STEP | FAST | SLOW | Atmosphere |
|---|---|---|---|
| 1 | 25° C./5 sec | 25° C./5 sec | $N_2/H_2O$ |
| 2 | 250° C./1 hr | 250° C./2 hrs | $N_2/H_2O$ |
| 3 | 250° C./1 hr | 250° C./1 hr | $N_2/H_2O$ |
| 4 | 750° C./2 hrs | 750° C./8 hrs | $N_2/H_2O$ |
| 5 | 825° C./30 min | 850° C./30 min | $O_2$ |
| 6 | 825° C./10 min | 850° C./30 min | $O_2$ |
| 7 | 600° C./1 hr | 600° C./2 hrs | $O_2$ |
| 8 | 25° C./6 hrs | 25° C./8 hrs | $O_2$ |

The mole ratio of the solution was 1.0:2.0:3.3 by atomic absorption spectroscopy.

| Wafer # | Baking | Firing | Mole ratio Y:Ba:Cu |
|---|---|---|---|
| 1 | none | fast | 1.0:2.1:0.6 |
| 2 | slow | fast | 1.0:2.3:0.9 |
| 3 | fast | fast | 1.0:2.3:0.9 |
| 4 | none | slow | 1.0:1.9:2.2 |
| 5 | slow | slow | 1.0:2.0:1.8 |
| 6 | fast | slow | 1.0:2.1:2.4 |

EXAMPLE 5

Two other solutions were prepared as in Example 4 with a slight increase of copper 2-amino-1-ethoxide. Films were spun and cured with a fast Intex and slow tube furnace profile.

| Solution mole ratio | mole ratio after firing |
|---|---|
| 1.0:1.9:3.6 | 1.0:2.3:2.0 |
| 1.0:1.9:3.9 | 1.0:2.2:3.5 |

We claim:
1. A process for forming an alkoxide-derived yttrium-barium-copper oxide high temperature superconductor thin film which comprises:
    (a) forming a thin film comprising solubilized yttrium and barium alkoxides, and copper aminoalkoxide under an inert gas atmosphere, on a non-reactive substrate, the amount of the copper aminoalkoxide being used at from about 110% to about 150%, by weight, of the stoichiometric amount to compensate for losses due to volatility of the copper aminoalkoxide;
    (b) heating the thin film from (a) first in a moisture laden inert gas atmosphere, to hydrolyze the aminoalkoxide, to a temperature in excess of the formation temperature of the superconductor; and
    (c) thereafter calcining the film in an oxygen atmosphere at a higher temperature to form the high temperature superconductor thin film
2. A process as claimed in claim 1 wherein the copper aminoalkoxide is copper 2-amino-1-ethoxide reagent.
3. A process as claimed in claim 1 wherein the non-reactive substrate is selected from the group consisting of zirconium oxide and magnesium oxide.
4. A process as claimed in claim 1 wherein the thermal processing in step (b) takes place at temperatures up to about 750° C.
5. A process as claimed in claim 1 wherein the calcining in step (c) takes place at higher temperatures than in step (b) up to about 850° C.
6. A process as claimed in claim 1 wherein the thermal processing in step (b) is at temperatures up to about 750° C., and the calcining in step (c) is at higher temperatures than used in step (b) and is up to about 850° C.

* * * * *